United States Patent
Kouno

(10) Patent No.: US 7,623,372 B2
(45) Date of Patent: Nov. 24, 2009

(54) NONVOLATILE SEMICONDUCTOR MEMORY FOR STORING MULTIVALUED DATA

(75) Inventor: Kazuyuki Kouno, Osaka (JP)

(73) Assignee: Panasonic Corporation, Osaka (JP)

( * ) Notice: Subject to any disclaimer, the term of this patent is extended or adjusted under 35 U.S.C. 154(b) by 221 days.

(21) Appl. No.: 11/593,607

(22) Filed: Nov. 7, 2006

(65) Prior Publication Data

US 2007/0153574 A1 Jul. 5, 2007

(30) Foreign Application Priority Data

Dec. 28, 2005 (JP) .............................. 2005-379641

(51) Int. Cl.
*G11C 16/04* (2006.01)
(52) U.S. Cl. ........................ 365/185.03; 365/185.17; 365/185.28
(58) Field of Classification Search ............ 365/185.03, 365/185.17, 185.28
See application file for complete search history.

(56) References Cited

U.S. PATENT DOCUMENTS

| 5,959,882 | A | 9/1999 | Yoshida et al. | |
|---|---|---|---|---|
| 6,426,892 | B2 * | 7/2002 | Shibata et al. | 365/185.03 |
| 7,035,144 | B2 * | 4/2006 | Kim et al. | 365/185.18 |
| 7,120,051 | B2 * | 10/2006 | Gorobets et al. | 365/185.02 |
| 7,193,896 | B2 * | 3/2007 | Shiga | 365/185.09 |
| 7,366,018 | B2 * | 4/2008 | Shibata | 365/185.18 |
| 2002/0110019 | A1 | 8/2002 | Satoh et al. | |
| 2004/0105314 | A1 | 6/2004 | Shibata et al. | |
| 2004/0196730 | A1 | 10/2004 | Jyouno et al. | |
| 2005/0207220 | A1 | 9/2005 | Takeuchi | |
| 2006/0064538 | A1 * | 3/2006 | Aizawa | 711/103 |

FOREIGN PATENT DOCUMENTS

| JP | 10-3792 | 1/1998 |
|---|---|---|
| JP | 2001-93288 A | 4/2001 |
| JP | 2007-3868 | 1/2007 |

OTHER PUBLICATIONS

Japanese Office Action, with English translation, issued in Japanese Patent Application No. JP 2005-379641, mailed Jul. 23, 2008.

* cited by examiner

*Primary Examiner*—Hoai V Ho
(74) *Attorney, Agent, or Firm*—McDermott Will & Emery LLP

(57) ABSTRACT

A nonvolatile semiconductor memory according to the invention includes a memory cell array comprised of a multivalued memory cell for storing data on a plurality of pages, a data processing circuit for carrying out a read operation for reading data from the memory cell array and a programming operation for writing the data to the memory cell array on a page unit, and a control circuit for controlling an operation of the data processing circuit, the control circuit changing an assignment of data corresponding to a threshold voltage distribution of the multivalued memory cell depending on order of a page over which the programming operation is to be carried out in such a manner that the programming operation is executed by a transition of a threshold voltage of the multivalued memory cell in a positive direction.

10 Claims, 9 Drawing Sheets

PROGRAM OF SECOND PAGE → FIRST PAGE

PROGRAM OF FIRST PAGE → SECOND PAGE

FIG. 6A

PROGRAM OF SECOND PAGE

| STATE OF MEMORY CELL | THRESHOLD VOLTAGE OF MEMORY CELL | DATA SECOND PAGE | DATA FIRST PAGE |
|---|---|---|---|
| 0 | 0V OR LESS | 1 | 1 |
| 1 | 0.3 ~ 0.5V | — | — |
| 2 | 0.8 ~ 1.0V | 0 | 1 |
| 3 | 1.3 ~ 1.5V | — | — |

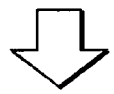

FIG. 6B

PROGRAM OF FIRST PAGE

| STATE OF MEMORY CELL | THRESHOLD VOLTAGE OF MEMORY CELL | DATA SECOND PAGE | DATA FIRST PAGE |
|---|---|---|---|
| 0 | 0V OR LESS | 1 | 1 |
| 1 | 0.3 ~ 0.5V | 1 | 0 |
| 2 | 0.8 ~ 1.0V | 0 | 0 |
| 3 | 1.3 ~ 1.5V | 0 | 1 |

FIG. 7A

PROGRAM OF FIRST PAGE

| STATE OF MEMORY CELL | THRESHOLD VOLTAGE OF MEMORY CELL | DATA SECOND PAGE | DATA FIRST PAGE |
|---|---|---|---|
| 0 | 0V OR LESS | 1 | 1 |
| 1 | 0.3 ~ 0.5V | 1 | 0 |
| 2 | 0.8 ~ 1.0V | — | — |
| 3 | 1.3 ~ 1.5V | — | — |

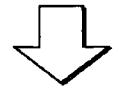

FIG. 7B

PROGRAM OF SECOND PAGE

| STATE OF MEMORY CELL | THRESHOLD VOLTAGE OF MEMORY CELL | DATA SECOND PAGE | DATA FIRST PAGE |
|---|---|---|---|
| 0 | 0V OR LESS | 1 | 1 |
| 1 | 0.3 ~ 0.5V | 1 | 0 |
| 2 | 0.8 ~ 1.0V | 0 | 0 |
| 3 | 1.3 ~ 1.5V | 0 | 1 |

FIG. 8A  FIRST PAGE READ
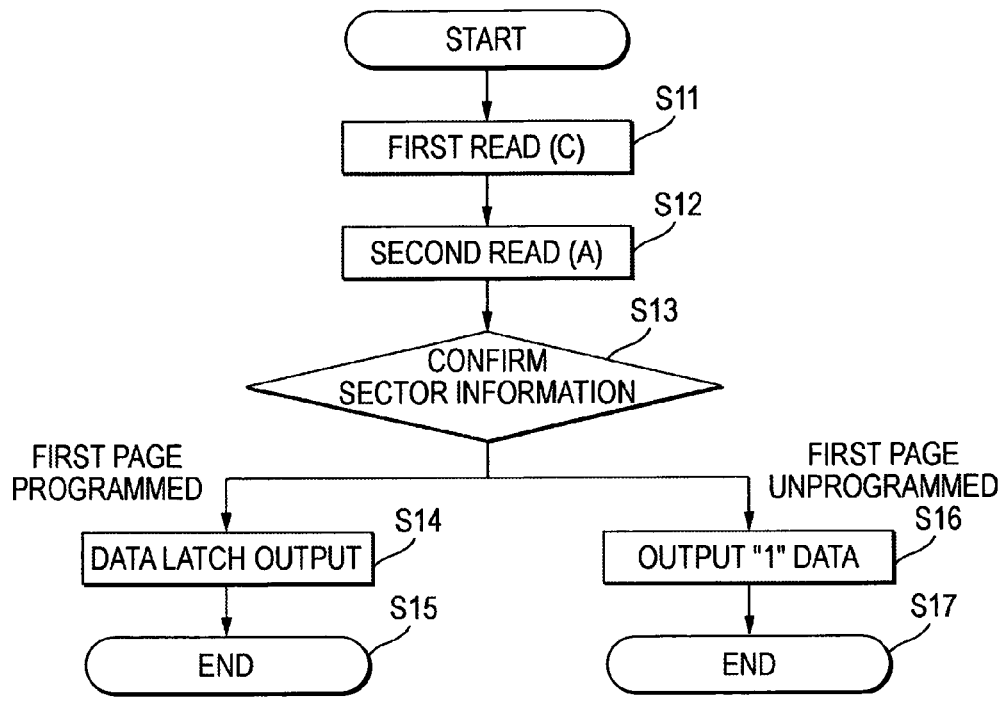
FIG. 8B  SECOND PAGE READ
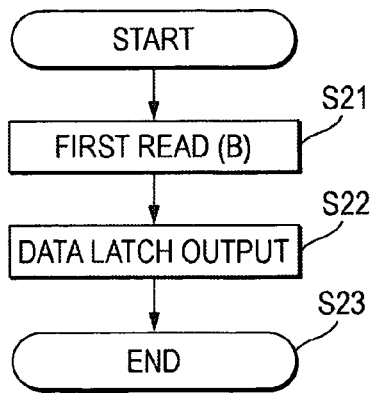

PROGRAM OF FIRST PAGE

| STATE OF MEMORY CELL | THRESHOLD VOLTAGE OF MEMORY CELL | DATA SECOND PAGE | FIRST PAGE |
|---|---|---|---|
| 0 | 0V OR LESS | 1 | 1 |
| 1 | 0.3 ~ 0.5V | 1 | 0 |
| 2 | 0.8 ~ 1.0V | — | — |
| 3 | 1.3 ~ 1.5V | — | — |

PROGRAM OF SECOND PAGE

| STATE OF MEMORY CELL | THRESHOLD VOLTAGE OF MEMORY CELL | DATA SECOND PAGE | FIRST PAGE |
|---|---|---|---|
| 0 | 0V OR LESS | 1 | 1 |
| 1 | 0.3 ~ 0.5V | 1 | 0 |
| 2 | 0.8 ~ 1.0V | 0 | 0 |
| 3 | 1.3 ~ 1.5V | 0 | 1 |

NONVOLATILE SEMICONDUCTOR MEMORY FOR STORING MULTIVALUED DATA

BACKGROUND OF THE INVENTION

1. Field of the Invention

The present invention relates to a nonvolatile semiconductor memory for storing multivalued data by an electrical rewrite.

2. Description of the Related Art

In recent years, a nonvolatile semiconductor memory, particularly, a flash memory can electrically rewrite data and can hold the data also in a state in which a power supply is turned OFF. Therefore, a large number of nonvolatile semiconductor memories have been used as memories for data storage of portable apparatuses such as a cell phone, a digital camera and a silicon audio player.

These portable apparatuses deal with images, animations and music data having a large data volume. In the nonvolatile semiconductor memory, therefore, it has been further demanded to implement an increase in a capacity and a reduction in a cost. Examples of a nonvolatile semiconductor memory capable of implementing the increase in a capacity and the reduction in a cost include an NAND type flash memory.

In order to implement the increase in a capacity and the reduction in a cost still more, moreover, the NAND type flash memory using a multivalued technique for storing data having 2 bits or more in one memory cell has been studied and developed vigorously.

For example, there has conventionally been proposed a nonvolatile semiconductor memory having 2-bit data in one memory cell, that is, four different threshold voltages in one memory cell (see JP-A-2001-93288).

FIG. 12 is a diagram showing a relationship between a threshold voltage distribution of a memory cell in the nonvolatile semiconductor memory described in JP-A-2001-93288 and data, and writing and reading methods. FIG. 13 is a diagram showing a relationship between data of the memory cell in the nonvolatile semiconductor memory described in JP-A-2001-93288 and write and read data.

As shown in FIGS. 12 and 13, a "state 0" to a "state 3" are defined in the ascending order of the threshold voltage of the memory cell. When an erasure is carried out, the data of the memory cell are brought into the "state 0". By a writing operation, consequently, the memory cell is set to be the "state 1" to the "state 3" in which the threshold voltage is high.

Data on different pages are stored in the 2-bit data to be stored in one memory cell. More specifically, data on first and second pages having different page addresses from each other are stored. In the 2-bit data to be stored in the "state 0" to the "state 3", moreover, the data on the first page are assigned to an LSB (Least Significant Bit) side and the data on the second page are assigned to an MSB (Most Significant Bit) side.

The threshold voltage in the "state 0" to the "state 3" and the data of the memory cell are assigned in such a relationship that the "state 0" is data "11", the "state 1" is data "10", the "state 2" is data "00" and the "state 3" is data "01".

Thus, the nonvolatile semiconductor memory in which the data are assigned executes a writing operation, that is, an operation for first writing the data on the first page and then writing the data on the second page in the case in which the data are written (programmed) to the memory cell.

For example, it is assumed that the threshold voltage of the memory cell is set into the "state 0" to be an erasing state in an initial condition. As described above, the data on the first page are first written to the memory cell. In the case in which the write data are "1", accordingly, the threshold voltage of the memory cell is maintained in the "state 0". In the case in which the write data are "0", moreover, the threshold voltage of the memory cell is brought into the "state 1".

Next, the data on the second page are written to the memory cell. At this time, in the case in which data "0" are written from an outside to the memory cell in which the threshold voltage is brought into the "state 1" by a writing operation for the first page, the threshold voltage of the memory cell is brought into the "state 2". In the case in which the data "0" are written from the outside to the memory cell in which the threshold voltage is maintained in the "state 0" by the writing operation for the first page, the threshold voltage of the memory cell is brought into the "state 3".

In the case in which the data "1" are written from the outside to the memory cell in which the threshold voltage is brought into the "state 1" by the writing operation for the first page, furthermore, the threshold voltage of the memory cell is maintained in the "state 1". In the case in which the data "1" are written from the outside to the memory cell in which the threshold voltage is maintained in the "state 0" by the writing operation for the first page, moreover, the threshold voltage of the memory cell is maintained in the "state 0".

On the other hand, in the case in which the data stored in the memory cell are read, the data to be read are "1" if the threshold voltage of the memory cell is set into the "state 0" or the "state 1" and are "0" if the threshold voltage of the memory cell is set in the "state 2" or the "state 3" when the data on the second page are to be read.

In the case in which the data on the second page are read, accordingly, whether the threshold voltage of the memory cell is set into the "state 1" or less or the "state 2" or more can be decided by only one reading operation. More specifically, by setting a word line voltage B for reading the second page to be a threshold, it is decided whether the threshold voltage of the memory cell is set into the "state 1" or less or the "state 2" or more.

On the other hand, in the case in which the data on the first page are read, the data to be read are "1" if the threshold voltage of the memory cell is set into the "state 0" or the "state 3" and are "0" if the threshold voltage of the memory cell is set into the "state 1" or the "state 2". In the case in which the data on the first page are read, accordingly, it is necessary to carry out two deciding operations in total including a decision whether the threshold voltage of the memory cell is set into the "state 0" or the "state 1" or more and a decision whether the threshold voltage of the memory cell is set into the "state 2" or less or the "state 3". Therefore, it is necessary to carry out two reading operations in total.

More specifically, it is decided whether the threshold voltage of the memory cell is set into the "state 0" or the "state 1" or more by setting, as a threshold, a reading word line voltage A of the first page and it is decided whether the threshold voltage of the memory cell is set into the "state 2" or less or the "state 3" by setting, as a threshold, a reading word line voltage C of the first page.

In the nonvolatile semiconductor memory described in JP-A-2001-93288, thus, the number of times of read is one in the case in which the second page is read and is two in the case in which the first page is read in the operations for reading the first and second pages. Thus, it is possible to carry out the reading operation in the number of times of read which is two at a maximum. Consequently, it is possible to perform a high speed reading operation.

[Non-Patent Document 1] 2005 IEEE International Solid-State Circuits Conference [2.2 An 8 Gb Multi-Level NAND Flash Memory with 63 nm STI CMOS Process Technology]

[Non-Patent Document 2] 2004 IEEE International Solid-State Circuits Conference [2.7 A 3.3V 4 Gb Four-Level NAND Flash Memory with 90 nm CMOS Technology]

On the other hand, referring to a writing operation, the threshold voltage of the memory cell carries out a transition from the "state 0" to be an erasing state (data "11") to the "state 3", that is, to a state in which the data on the first page are "1" and the data on the second page are "0" (data "01") in the case in which an operation for writing the second page to the memory cell set in the erasing state is first performed and write data are "0".

In the case in which an operation for writing the first page is carried out and the write data are "0", subsequently, it is necessary to drop the threshold voltage of the memory cell in order to assign preset data, and furthermore, to cause the threshold voltage of the memory cell to carry out a transition from the "state 3" to the "state 2", that is, a transition to a state 2 (data "00") in which the data on the first page is "0" and the data on the second page is "0".

Referring to the operation for dropping the threshold voltage of the memory cell, however, a flash memory is only permitted to carry out an erasing operation for collectively dropping a threshold voltage on a unit of a block in respect of a structure of a circuit and cannot set a threshold voltage of only a specific memory cell into a low state. Accordingly, the nonvolatile semiconductor memory described in the JP-A-2001-93288 cannot carry out the writing operation in order of the second page and the first page but can carry out the writing operation only in order of the first page and the second page.

Thus, restrictions on the writing order in which the writing operation cannot be executed in optional page order forcibly cause an apparatus mounting the nonvolatile semiconductor memory thereon and a control apparatus for controlling the nonvolatile semiconductor memory to carry out a complicated rewrite control. Consequently, there is generated the case in which an address space of the nonvolatile semiconductor memory cannot be used efficiently.

SUMMARY OF THE INVENTION

In order to solve the problems, it is an object of the invention to provide a nonvolatile semiconductor memory capable of reading data at a high speed and storing multivalued data which can be written in optional page order.

A nonvolatile semiconductor memory according to the invention has such a structure as to comprise a memory cell array comprised of a multivalued memory cell for storing data on a plurality of pages, a data processing circuit for carrying out a read operation for reading data from the memory cell array and a programming operation for writing the data to the memory cell array on a page unit, and a control circuit for controlling the operations of the data processing circuit, the control circuit changing an assignment of data corresponding to a threshold voltage distribution of the multivalued memory cell depending on order of a page in which the programming operation is to be carried out in such a manner that a transition of a threshold voltage of the multivalued memory cell in a positive direction is performed to execute the programming operation.

By the structure, the assignment of the data corresponding to the threshold voltage distribution of the memory cell is properly changed corresponding to the order of the page in which the programming operation is to be carried out in such a manner that the programming operation is carried out by moving the threshold voltage of the memory cell in the positive direction. Therefore, there is not generated the case in which the threshold voltage of the memory cell is moved in a negative direction. Accordingly, it is possible to carry out the programming operation in optional page order irrespective of the order of the page to be programmed.

Moreover, the nonvolatile semiconductor memory according to the invention has such a structure as to further comprise programming order information storage means for storing order of a page in an execution of the programming operation, the control circuit determining data corresponding to the threshold voltage distribution of the memory cell by referring to the programming order information, thereby carrying out the read operation.

By the structure, the data corresponding to the threshold voltage distribution of the multivalued memory cell are determined by referring to the programming order information in the read operation in such a manner that the change in the assignment of the data in the programming operation does not influence the read operation. Therefore, it is possible to read the data accurately at a high speed.

Furthermore, a nonvolatile semiconductor memory according to the invention has such a structure as to comprise a memory cell array comprised of a multivalued memory cell for assigning data on a first page and a second page to different threshold voltages set in a "state 0", a "state 1", a "state 2" and a "state 3" and storing the same data, a data processing circuit for carrying out a programming operation for writing data on a first or second logic level supplied from an outside to the memory cell array on a page unit and a read operation for reading the data from the memory cell array, and a control circuit for controlling the operations of the data processing circuit depending on order of a page in which the programming operation is to be carried out, wherein in the case in which the programming operation is to be carried out in order of the first page and the second page, the control circuit holds the "state 0" when a first logic level is to be programmed and carries out a change from the "state 0" to the "state 1" when a second logic level is to be programmed in the programming operation for the first page, and in the programming operation for the second page, the control circuit holds the "state 0" when the first logic level is to be programmed and carries out a change from the "state 0" to the "state 3" when the second logic level is to be programmed in the case in which the first logic level is stored in the first page, and holds the "state 1" when the first logic level is to be programmed and carries out a change from the "state 1" to the "state 2" when the second logic level is to be programmed in the case in which the second logic level is stored in the first page, and in the case in which the programming operation is to be carried out in order of the second page and the first page, the control circuit holds the "state 0" when the first logic level is to be programmed and carries out a change from the "state 0" to the "state 2" when the second logic level is to be programmed in the programming operation for the second page, and in the programming operation for the first page, the control circuit holds the "state 0" when the first logic level is to be programmed and carries out a change from the "estate 0" to the "state 1" when the second logic level is to be programmed in the case in which the first logic level is stored in the second page, and carries out a change from the "state 2" to the "state 3" when the first logic level is to be programmed and holds the "state 2" when the second logic level is to be programmed in the case in which the second logic level is stored in the second page.

By the structure, the assignment of the data on the first or second logic level corresponding to the threshold voltage distribution of the "state 0", the "state 1", the "state 2" and the "state 3" of the memory cell is properly changed corresponding to the order of the page to be programmed in such a manner that the threshold voltage of the memory cell is moved in the positive direction to carry out the programming operation. Therefore, there is not generated the case in which the threshold voltage of the memory cell is moved in a negative direction. Thus, it is possible to carry out the programming operation in optional page order irrespective of the order for programming the first page and the second page.

Moreover, the nonvolatile semiconductor memory according to the invention has such a structure as to further comprise programming order information storage means for storing order of a page in an execution of a programming operation, the control circuit referring to the programming order information, and in case of a state in which only the first page is programmed or a state in which the first page and the second page are programmed, outputting the first logic level when the threshold voltage of the multivalued memory cell is set in the "state 0" and the "state 3" and outputting the second logic level when the threshold voltage of the multivalued memory cell is set in the "state 1" and the "state 2" in an operation for reading the first page, and outputting the first logic level when the threshold voltage of the multivalued memory cell is set in the "state 0" and the "state 1" and outputting the second logic level when the threshold voltage of the multivalued memory cell is set in the "state 2" and the "state 3" in an operation for reading the second page, and in case of a state in which only the second page is programmed, outputting the first logic level irrespective of a state of the threshold voltage of the multivalued memory cell in the operation for reading the first page, and outputting the first logic level when the threshold voltage of the multivalued memory cell is set in the "state 0" and the "state 1" and outputting the second logic level when the threshold voltage of the multivalued memory cell is set in the "state 2" and the "state 3" in the operation for reading the second page.

By the structure, the assignment of the data corresponding to the threshold voltage distribution of the "state 0", the "state 1", the "state 2" and the "state 3" of the memory cell is determined with reference to the programming order information about the first page and the second page in the read operation in such a manner that the change in the assignment of the data in the programming operation does not influence the read operation. Therefore, it is possible to accurately read the data by two reading operations at a maximum.

Furthermore, the nonvolatile semiconductor memory according to the invention has such a structure that the control means carries out an operation for storing programming order information in the programming order information storage means simultaneously with a programming operation to be performed over the memory cell array.

By the structure, the programming operation for the programming order information storage means is carried out simultaneously with the programming operation to be performed over the memory cell array. Consequently, it is possible to effectively eliminate a time taken for the programming operation over the programming order information storage means. Therefore, it is possible to carry out the programming operation in optional page order without increasing a program duration of the memory cell array.

Moreover, the nonvolatile semiconductor memory according to the invention has such a structure that the control means carries out a read operation for the programming order information stored in the programming order information storage means simultaneously with a read operation to be performed over the memory cell array.

By the structure, the read operation for the data stored in the programming order information storage means is carried out simultaneously with the read operation to be performed over the memory cell array. Consequently, it is possible to effectively eliminate a time taken for the read operation over the programming order information storage means. Therefore, it is possible to carry out the programming operation in optional page order with maintaining an increase in the reading speed of the memory cell array.

In the nonvolatile semiconductor memory according to the invention, furthermore, the programming order information storage means is comprised of a memory cell connected to an identical word line to the multivalued memory cell.

By the structure, the programming order information storage means is comprised of the memory cell connected to the identical word line to the memory cell. When the word line is selected in the reading operation or programming operation of the memory cell, therefore, the memory cell of the programming order information storage means is also selected at the same time. Consequently, the control of the read operation or the programming operation of the memory cell of the programming order information storage means can easily be implemented, and furthermore, the read operation and the programming operation over the programming order information storage means can readily be carried out simultaneously with the read operation and the programming operation of the memory cell.

Moreover, the nonvolatile semiconductor memory according to the invention has such a structure that the programming order information storage means stores data at a threshold voltage set in the "state 3" of the multivalued memory cell.

In the nonvolatile semiconductor memory according to the invention, furthermore, the programming order information storage means is comprised of a ferroelectric memory (FeRAM).

By the structure, the speed of the programming operation or the read operation over the programming order information storage means can be increased, and furthermore, an overwrite can be carried out. Therefore, the programming operation over the programming order information storage means can easily be controlled. Consequently, it is possible to enhance a performance of the nonvolatile semiconductor memory.

In the nonvolatile semiconductor memory according to the invention, moreover, the memory cell array is comprised of an NAND type memory cell array.

In the nonvolatile semiconductor memory according to the invention, furthermore, the memory cell array is comprised of an AND type memory cell array.

In the nonvolatile semiconductor memory according to the invention, moreover, the memory cell array is comprised of an NOR type memory cell array.

According to the invention, it is possible to provide a nonvolatile semiconductor memory for storing multivalued data which can increase a speed of an operation for reading data and can carry out a writing operation in optional page order.

BRIEF DESCRIPTION OF THE DRAWINGS

FIG. 6 is a diagram showing the relationship between the data of the memory cell and the threshold voltage distribution of the memory cell in the case in which the writing operation is carried out in order of the second page and the first page, FIG. 7 is a diagram showing the relationship between the data of the memory cell and the threshold voltage distribution of the memory cell in the case in which the writing operation is carried out in order of the first page and the second page, FIG. 8 is a flowchart for explaining a reading operation (a read operation) of the nonvolatile semiconductor memory 200 according to the first embodiment.

DESCRIPTION OF THE PREFERRED EMBODIMENTS

Embodiments according to the invention will be described below in detail with reference to the drawings.

First Embodiment

Figure 1:
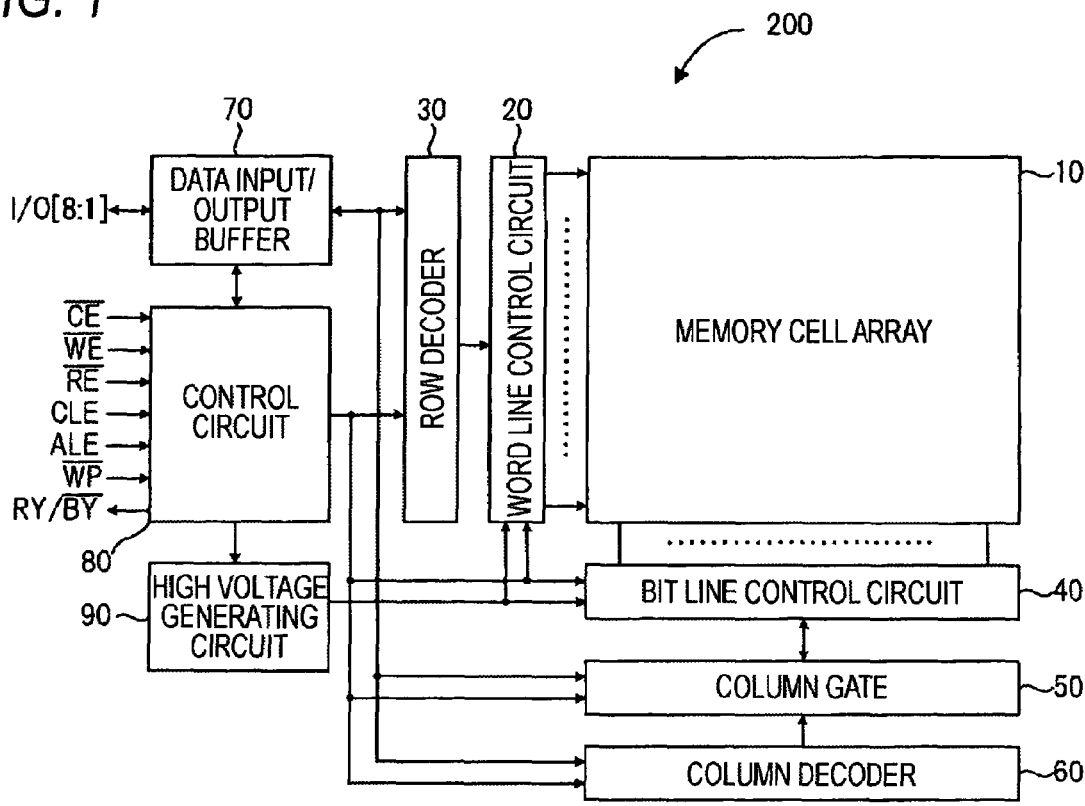
FIG. 1 is a diagram showing a schematic structure of a nonvolatile semiconductor memory 200 according to a first embodiment.

FIG. 1 is a diagram showing a schematic structure of a nonvolatile semiconductor memory 200 according to a first embodiment. In FIG. 1, a memory cell array 10 includes a plurality of word lines and a plurality of bit lines, and memory cells are disposed in a matrix on intersecting points of the word lines and the bit lines. A word line control circuit 20 and a bit line control circuit 40 are connected to the memory cell array 10.

The word line control circuit 20 serves to select a predetermined word line in the memory cell array 10 and to apply necessary voltages for read, write (programming) and erase. A row decoder 30 serves to control the word line control circuit 20, thereby selecting a predetermined word line.

The bit line control circuit 40 includes a plurality of data latch circuits as will be described below, and serves to read data of the memory cell in the memory cell array 10 through the bit line, to detect (verify) the state of the memory cell in the memory cell array 10 through the bit line or to apply a writing voltage to the memory cell in the memory cell array 10 through the bit line, thereby carrying out writing to the memory cell. Moreover, a column gate 50, a column decoder 60 and a data input/output buffer 70 are connected to the bit line control circuit 40.

The data latch circuit in the bit line control circuit 40 is selected by the column gate 50 and the column decoder 60, and data of a multivalued memory cell read to the data latch circuit are output from a data input/output terminal I/O [8:1] to an outside through the data input/output buffer 70. Moreover, write data input from the outside to the data input/output terminal I/O [8:1] are input to the data latch circuit selected by the column gate 50 and the column decoder 60 through the data input/output buffer 70.

A control circuit 80 serves to wholly control the nonvolatile semiconductor memory 200 and controls the word line control circuit 20, the row decoder 30, the bit line control circuit 40, the column gate 50, the column decoder 60, the data input/output buffer 70 and a high voltage generating circuit 90, thereby controlling various operations such as a reading operation, a writing operation and an erasing operation.

A chip enable signal/CE, a write enable signal/WE, a read enable signal/RE, a command latch enable signal CLE, an address latch enable signal ALE, a write protect signal/WP and a ready—busy signal RY/BY are input from the outside to the control circuit 80. Moreover, an address, data and a command are input from the data input/output terminal I/O [8:1] to the control circuit 80 through the data input/output buffer circuit 70.

The high voltage generating circuit 90 serves to generate a necessary voltage for the nonvolatile semiconductor memory 200 to execute the reading, writing and erasing operations.

Figure 2:
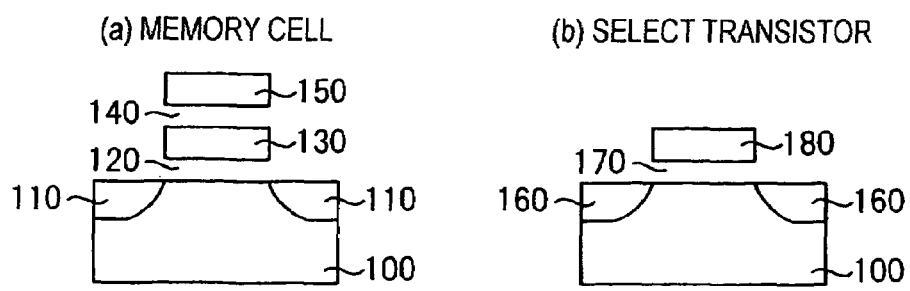
FIG. 2 is a view showing sectional structures of a memory cell and a select transistor which are to be used in the nonvolatile semiconductor memory 200.

FIGS. 2(a) and 2(b) are views showing sectional structures of a memory cell and a select transistor which are used for the nonvolatile semiconductor memory 200. FIG. 2(a) shows the memory cell. An N-type diffusion layer 110 to be a source and a drain of a memory cell is formed on a substrate 100. A floating gate 130 is formed on the substrate 100 through a gate insulating film 120. A control gate 150 is formed on the floating gate 130 through an insulating film 140. FIG. 2(b) shows the select transistor. An N-type diffusion layer 160 to be a source and a drain is formed on the substrate 100. A control gate 180 is formed on the substrate 100 through a gate insulating film 170.

Figure 3:
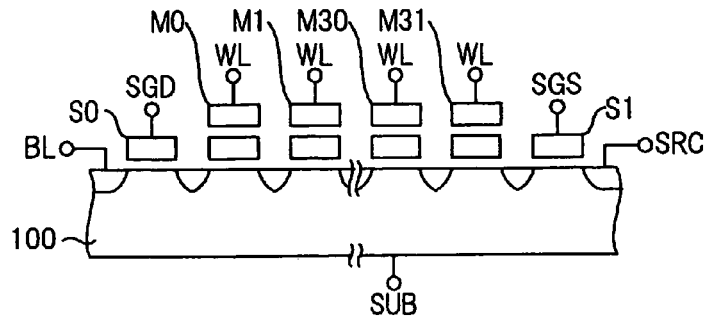
FIG. 3 is a view showing a sectional structure of an NAND type memory cell array to be used in the nonvolatile semiconductor memory 200.

FIG. 3 is a view showing a sectional structure of an NAND type memory cell array to be used in the nonvolatile semiconductor memory 200. In this example, the NAND type memory cell array is comprised of connecting 32 memory cells M0 to M31 having the structure shown in FIG. 2(a) in series. Select transistors S0 and S1 having the structure shown in FIG. 2(b) are provided on the drain and source sides of the NAND type memory cell.

Figure 4:
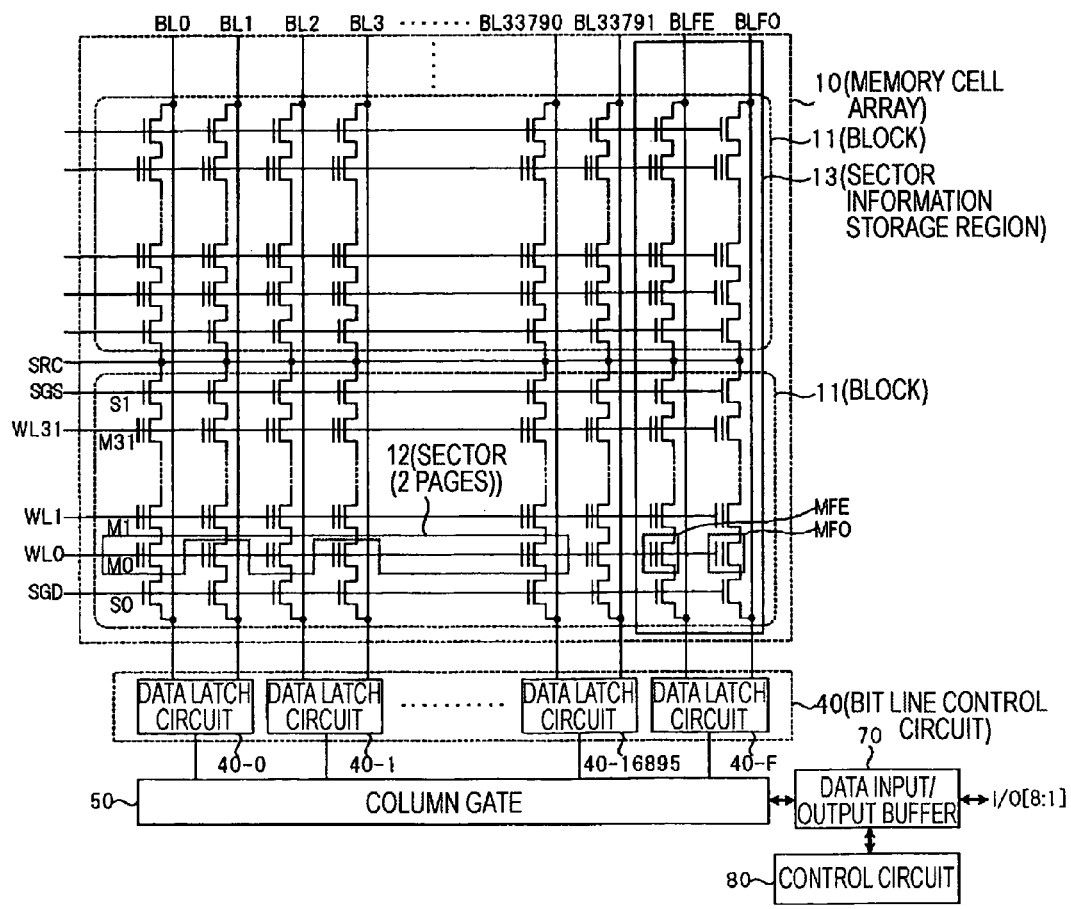
FIG. 4 is a diagram showing structures of a memory cell array and a bit line control circuit in the nonvolatile semiconductor memory 200.

FIG. 4 is a diagram showing the structures of the memory cell array 10 and the bit line control circuit 40 in the nonvolatile semiconductor memory 200. The bit line control circuit 40 has a plurality of data latch circuits 40-0 to 40-16895. Each of the data latch circuits 40-0 to 40-16895 is connected to the data input/output buffer 70 through the column gate 50.

Moreover, a pair of bit lines are connected to each of the data latch circuits 40-0 to 40-16895. More specifically, bit lines BL0 and BL1 are connected to the data latch circuit 40-0, bit lines BL2 and BL3 are connected to the data latch circuit 40-1, and bit lines BL33790 and BL33791 are connected to the data latch circuit 40-16895.

Furthermore, a plurality of NAND type memory cells is disposed in the memory cell array 10. One of the NAND type memory cells is comprised of the 32 memory cells M0 to M31 connected in series, the select transistor S0 connected to the memory cell M0, and the select transistor S1 connected to the memory cell M31. The select transistor S0 is connected to the bit line BL0 and the select transistor S1 is connected to a source line SRC. Control gates of the memory cells M0 to M31 disposed in each row are connected to word lines WL0 to WL31 in common. Moreover, the select transistor S0 is connected to a select line SGD in common and the select transistor S1 is connected to a select line SGS in common.

A block 11 is comprised of setting 32 word lines to be a unit and data are erased on the unit of the block. The sector 12 is comprised of a memory cell connected to one word line. The memory cell connected to one word line is comprised of two sectors.

More specifically, description will be given by taking a memory cell connected to the word line WL0 as an example. There are provided the sector 12 (the sector 12 shown in FIG. 4) comprised of a memory cell group connected to even-numbered bit lines and the sector 12 comprised of a memory cell group connected to odd-numbered bit lines. The nonvolatile semiconductor memory 200 according to the first embodiment stores data corresponding to two pages of the first and second pages in one memory cell. Therefore, the data corresponding to the two pages are stored in one sector 12. The page represents a unit of a data processing to be carried out at a time in a programming operation.

Moreover, the memory cell array 10 includes a sector information storage region 13 (programming order information storage means) for storing information (programming order information) about page order in which writing to each sector 12 is carried out. The sector information storage region 13 is disposed in the memory cell array 10 and is connected to bit lines BLFE and BLFO. Moreover, the sector information storage region 13 is also connected to the word lines WL0 to WL31, the select lines SGD and SGS, and the source line SRC.

Sector information of the sector 12 (the sector 12 shown in FIG. 4) connected to the word line WL0 and the even-numbered bit lines is stored in a memory cell MFE connected to the same word line WL0 and the bit line BLFE.

Similarly, sector information of the sector 12 connected to the word line WL0 and the odd-numbered bit lines is stored in a memory cell MFO connected to the same word line WL0 and the bit line BLFO. Referring to the other word lines, similarly, the sector information storage region 13 is stored in a memory cell which is common to the word line connected to the sector to be an object and is connected to the bit lines BLFE and BLFO.

The data latch circuit 40-F in the bit line control circuit 40 is connected to the bit lines BLFE and BLFO to which the sector information storage region 13 is connected. More specifically, the information stored in the sector information storage region 13 is read and written by the data latch circuit 40-F.

More specifically, information about whether the writing operation for the first page (a programming operation) is executed is stored as information (programming order information) to be stored in the sector information storage region 13. In other words, in the case in which the memory cell of the sector information storage region 13 is set in an erasing state, a notice that the programming operation for the first page is not carried out is given to the memory cell. To the contrary, in the case in which the same memory cell is set in a writing state, a notice that the programming operation for the first page is carried out is given to the memory cell. Herein, the threshold voltage of the memory cell in the writing state of the sector information storage region 13 is set to be the "state 3".

Figure 5A:
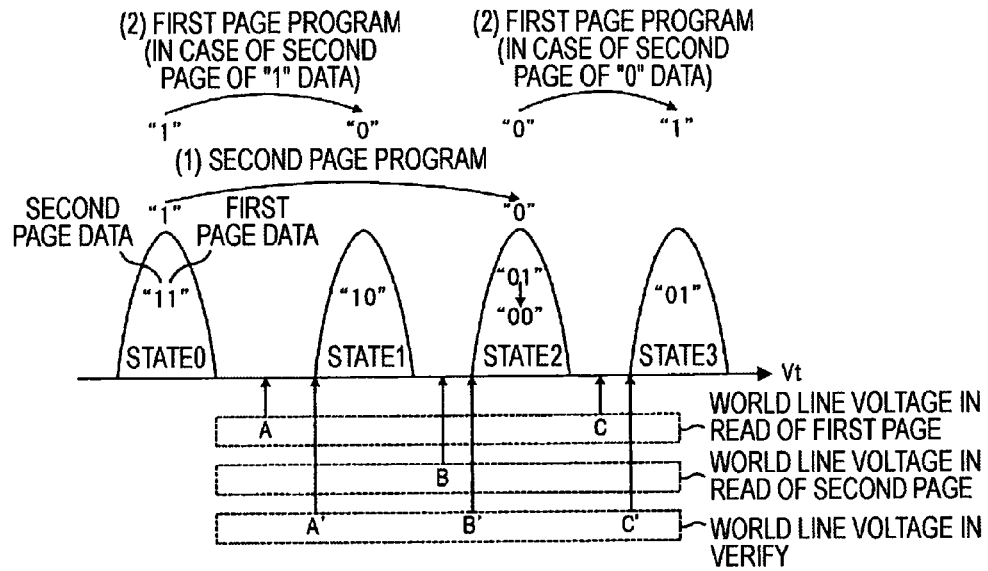
FIG. 5(a) is a diagram showing a relationship between data of a memory cell and a threshold voltage distribution of the memory cell in the case in which a writing operation is carried out in order of a second page and a first page and FIG. 5(b) is a diagram showing a relationship between the data of the memory cell and the threshold voltage distribution of the memory cell in the case in which the writing operation is carried out in order of the first page and the second page.
Figure 5B:
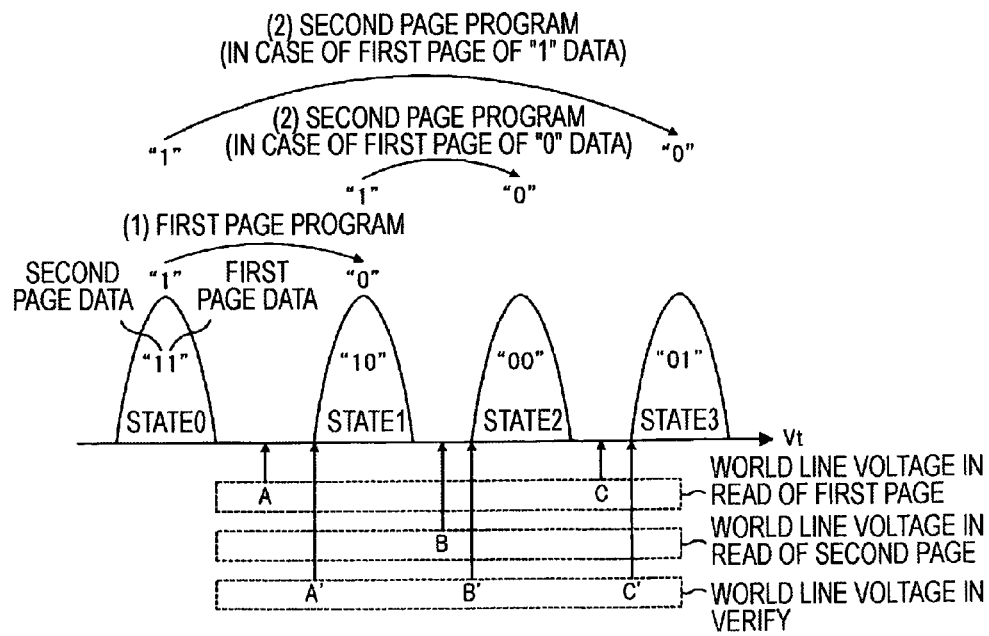

Next, an operation principle of the nonvolatile semiconductor memory 200 according to the first embodiment of the invention will be described with reference to the drawings. FIG. 5(a) is a diagram showing a relationship between the data of the memory cell and the threshold voltage distribution of the memory cell in the case in which the writing operation is carried out in order of the second page and the first page. FIG. 5(b) is a diagram showing a relationship between the data of the memory cell and the threshold voltage distribution of the memory cell in the case in which the writing operation is carried out in order of the first page to the second page. FIGS. 6(a) and 6(b) show, in a table, the relationship between the data of the memory cell and the threshold voltage distribution of the memory cell in the case in which the writing operation is carried out in order of the second page and the first page. FIGS. 7(a) and 7(b) show, as a table, the relationship between the data of the memory cell and the threshold voltage distribution of the memory cell in the case in which the writing operation is carried out in order of the first page and the second page.

As shown in FIGS. 5(a) and 5(b), the nonvolatile semiconductor memory 200 has 2-bit data in one memory cell, that is, four different threshold voltages in one memory cell, and the "state 0" to the "state 3" are defined in ascending order of the threshold voltage of the memory cell. When the erasure is carried out, the threshold voltage of the memory cell is brought into the "state 0". By the writing operation, consequently, the memory cell is brought into the "state 1" to the "state 3" in which the threshold voltage is raised.

The data on the first page and the data on the second page which have different page addresses are stored in the 2-bit data to be stored in one memory cell. In the 2-bit data stored in the "state 0" to the "state 3", moreover, the data on the first page are assigned to an LSB (Least Significant Bit) side and the data on the second page are assigned to an MSB (Most Significant Bit) side.

The nonvolatile semiconductor memory 200 according to the first embodiment changes the assignment of the data corresponding to the threshold voltage distribution of the memory cell according to order for writing the pages, that is, whether the programming (writing) is carried out in order of the first page and the second page or in order of the second page and the first page, thereby carrying out the programming operation.

The assignment of the data corresponding to the threshold voltage distribution of the memory cell is changed and determined in such a manner that the threshold voltage of the memory cell is moved in a positive direction to carry out the programming operation irrespective of the order for writing the pages. In the nonvolatile semiconductor memory 200 according to the first embodiment, accordingly, the assignment of the data is changed when the programming operation is carried out in the order of the second page and the first page.

With reference to FIGS. 5(a), 6(a) and 6(b), the change in the assignment of the data will be described in detail. First of all, it is assumed that the threshold voltage of the memory cell is set into the "state 0" to be the erasing state. In the case in which the data on the second page are written to the memory cell and the write data are "1", the threshold voltage of the memory cell is maintained in the "state 0". On the other hand, when the write data are "0", a transition of the threshold voltage of the memory cell to the "state 2" is carried out.

In the case in which data "0" are programmed by the programming operation for the second page, the assignment of data "00" in the "state 2" is changed to data "01" to carry out the transition to the "state 2". More specifically, in the memory cell set in the "state 2", the data "00" are maintained in the case in which the programming is carried out in the order of the first page and the second page. However, data are assigned to the data "01" to carry out the programming operation in the case in which the programming is performed from the second page. When the programming operation for the second page is completed, the threshold voltage of the memory cell is set in the "state 0" (data "11") or the "state 2" (data "01") as shown in FIG. 6(a).

Next, the data on the first page are written. At this time, in the case in which write data "0" are supplied from the outside to the memory cell in which the threshold voltage is maintained in the "state 0" by the programming operation for the second page, the threshold voltage of the memory cell is set into the "state 1". On the other hand, in the case in which the write data "1" are supplied from the outside, the threshold voltage of the memory cell holds the "state 0".

Moreover, in the case in which the write data "0" are supplied from the outside to the memory cell in which the threshold voltage is maintained in the "state 2" by the writing operation for the second page, the data of the memory cell hold the "state 2". On the other hand, in the case in which the write data "1" are supplied from the outside, the data of the memory cell are brought into the "state 3".

The invention is different from the conventional art in that a transition from the "state 2" to the "state 3" is carried out in the case in which the memory cell is set in the "state 2", that is, the case in which the data "0" are programmed by the programming operation for the second page and the case in which the program data are "1" by the programming operation for the first page, and the "state 2" is held in the case in which the program data are "0".

More specifically, a control is usually carried out in such a manner that the threshold voltage is subjected to a transition in a positive direction when the data are "0" and is held when the data are "1". On the other hand, when first carrying out the programming operation of the data "0" over the second page and then performing the programming operation for the first page, the nonvolatile semiconductor memory 200 carries out a control to perform a transition in the positive direction over the threshold voltage in the case in which the write data are "1" and to hold the threshold voltage in the case in which the data are "0".

On the other hand, in the case in which the programming operation is carried out in the order of the first page and the second page as shown in FIGS. 5(b), 7(a) and 7(b), it is not necessary to change the assignment of the data. Therefore, the programming operation is carried out in the same manner as in the conventional art.

By the operation principle, the data "01" are set in the "state 2" in the case in which the programming operation for the second page is first carried out. However, the data set in the "state 2" are subjected to a transition to the same data "00" as that in the conventional art by the programming operation for the first page which is to be carried out later. In the assignment of the data corresponding to the threshold voltage after the programming operation is carried out in the order of the second page and the first page, accordingly, the "state 0" carries out a transition to the data "11", the "state 1" carries out a transition to the data "10" the "state 2" carries out a transition to the data "00" and the "state 3" carries out a transition to the data "01" in the same manner as in the conventional art.

Even if the programming operation is carried out in the order of the second page and the first page, therefore, the programming is carried out by setting the assignment of corresponding data and the threshold voltage in such a manner that the transition of the threshold voltage is performed in the positive direction. Thus, the programming operation can be carried out in optional page order.

On the other hand, in both the case in which the programming is carried out in the order of the first page and the second page and the case in which the programming is carried out in the order of the second page and the first page, the "state 0", the "state 1", the "state 2" and the "state 3" are the data "00", "10", "00" and "01" for the value of the data corresponding to the threshold voltage of the memory cell respectively, which is equivalent to those described in the conventional art. In the case in which the data stored in the memory cell are read, therefore, it is possible to read the data by two reading operations at a maximum.

More specifically, in the case in which the data on the second page are read, data read to have the threshold voltage of the memory cell which is set in the "state 0" or the "state 1" are the data "1" and data read to have the threshold voltage of the memory cell which is set in the "state 2" or the "state 3" are the data "0". In the case in which the data on the second page are read, therefore, it is possible to decide whether the threshold voltage of the memory cell is set in the "state 1" or less or the "state 2" or more by only one reading operation (a second page reading word line potential B).

On the other hand, in the case in which the data on the first page are read, data read to have the threshold voltage of the memory cell which is set in the "state 0" or the "state 3" are the data "1" and data read to have the threshold voltage of the memory cell which is set in the "state 1" or the "state 2" are the data "0". In the case in which the data on the first page are read, accordingly, it is necessary to carry out two reading operations in total including a decision whether the threshold voltage of the memory cell is set in the "state 0" or the "state 1" or more and a decision whether the threshold voltage of the memory cell is set in the "state 2" or less or the "state 3" (first page reading word line potentials A and C).

In the operations for reading the first page and the second page, therefore, the number of times of read is one in case of the reading operation for the second page, and the number of times of read is two in case of the reading operation for the first page. Thus, it is possible to carry out the reading operation in the number of times which is two at a maximum. Consequently, it is possible to carry out the reading operation at a high speed.

More specifically, according to the operation principle, the control is carried out to cause the assignment of the data corresponding to the threshold voltage distribution of the memory cell to be variable, thereby executing the programming operation according to the order of the page in which data on a plurality of pages stored in one memory cell are to be programmed. Thus, the assignment of the data corresponding to the threshold voltage distribution of the memory cell is set to have such a threshold voltage value that the transition in the positive direction can be carried out over the threshold voltage of the memory cell by a programming operation to be performed later.

Accordingly, it is possible to prevent the generation of the case in which the threshold voltage of the memory cell is subjected to a transition in a negative direction by the subsequent programming operation. Therefore, it is possible to accurately set the threshold voltage of the memory cell. Consequently, it is possible to implement the programming operation in optional page order. Furthermore, it is possible to carry out the reading operation in the number of times of read which is two at a maximum. Thus, it is possible to carry out a high-speed reading operation and a programming operation in optional page order.

Referring to the reading operation, there will be considered the case in which the reading operation is carried out including the case in which only the first page is programmed and the case in which only the second page is programmed except for the case in which the programming is carried out in the order of the first page and the second page and the case in which the programming is carried out in the order of the second page and the first page. As shown in FIGS. 5(a) and 5(b), the data of the memory cell set in the "state 0" (data "11"), the "state 1" (data "10") and the "state 3" (data "01") are always identical in all of the cases.

On the other hand, the data of the memory cell set in the "state 2" are "00" in the case in which the programming is carried out in the order of the first page and the second page, the case in which the programming is carried out in the order of the second page and the first page, and the case in which only the first page is programmed, while the data are "01" in the case in which only the second page is programmed. The assignment of the data set in the "state 2" is varied depending on the order of the programming operation for the memory cell. For this reason, the accurate reading operation cannot be carried out by the reading method described in the JP-A-2001-93288.

In order to accurately read the data, it is necessary to grasp information about the order of the page in which the memory cell is to be programmed (programming order information) and to decide the condition of the data set in the "state 2". In order to implement them, the sector information storage region 13 (programming order information storage means) for storing information about the order of the page in which the memory cell is being programmed is mounted and the assignment of the data corresponding to the threshold voltage distribution of the memory cell is determined to carry out the reading operation based on the data stored in the sector information storage region 13. Also in the case in which the memory cell is programmed in any page order, therefore, the reading operation can be carried out accurately.

In the operation principle, there is provided the sector information storage region 13 for storing the information about the order of a plurality of pages in which the programming has been carried out, and the assignment of the data corresponding to the threshold voltage distribution of the memory cell is caused to be variable and the programming operation is thus executed depending on order of the pages in which the programming is to be carried out. Based on the data stored in the sector information storage region 13, moreover, the assignment of the data corresponding to the threshold voltage distribution of the memory cell is determined to carry out the reading operation. Also in the case in which the memory cell is programmed in any page order, therefore, it is possible to accurately carry out the reading operation. In the programming operation for the pages, furthermore, even if a power supply is turned OFF when a certain page is completely programmed, the information about the page order for the programming is stored in the sector information storage region 13. Also after the power supply is turned ON again, therefore, it is possible to carry out the programming operation for the residual pages. Thus, it is possible to enhance the utility of the nonvolatile semiconductor memory 200 and to efficiently utilize an address space.

Figure 9:
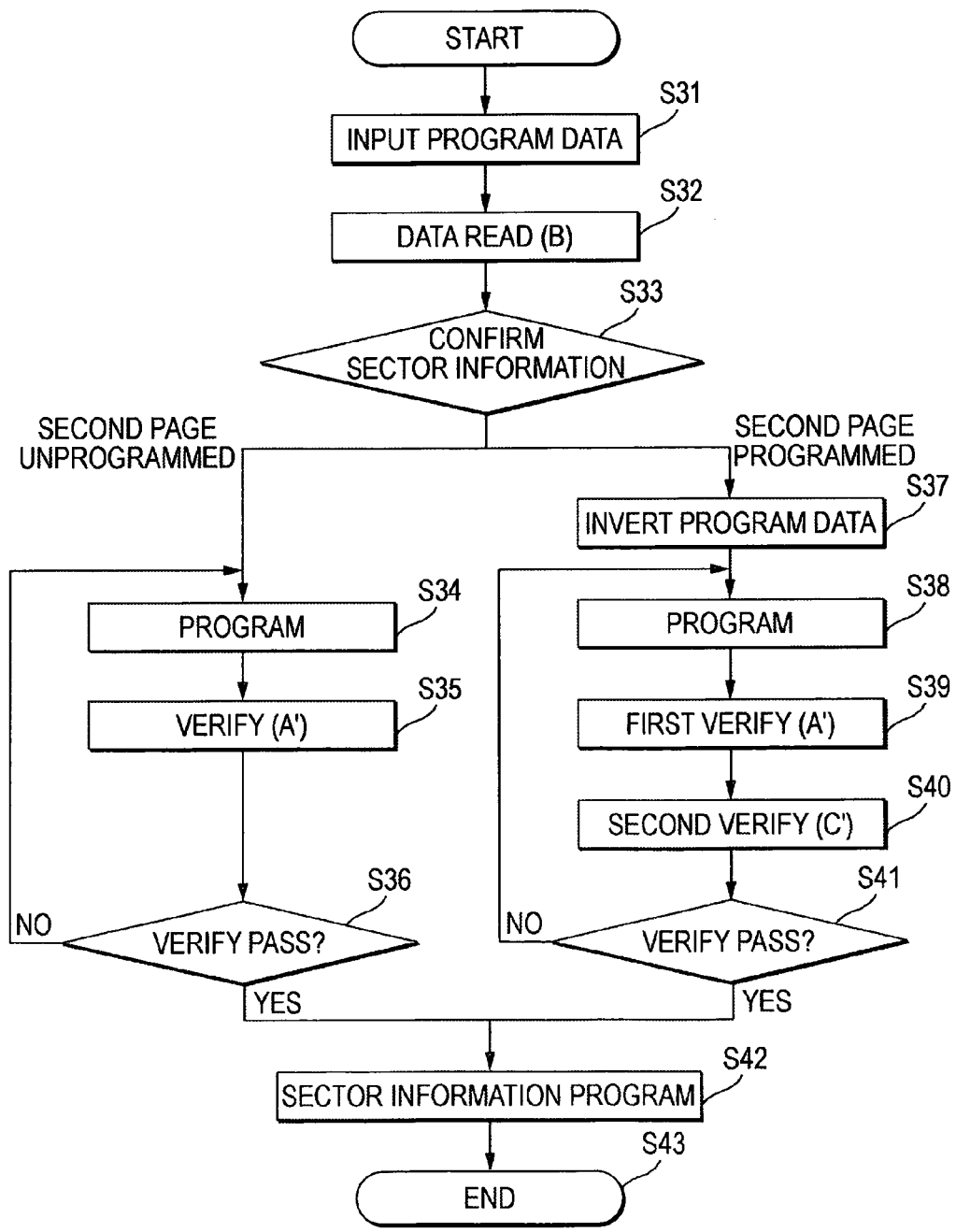
FIG. 9 is a flowchart for explaining a writing operation (a first page programming operation) of the nonvolatile semiconductor memory 200 according to the first embodiment.
Figure 10:
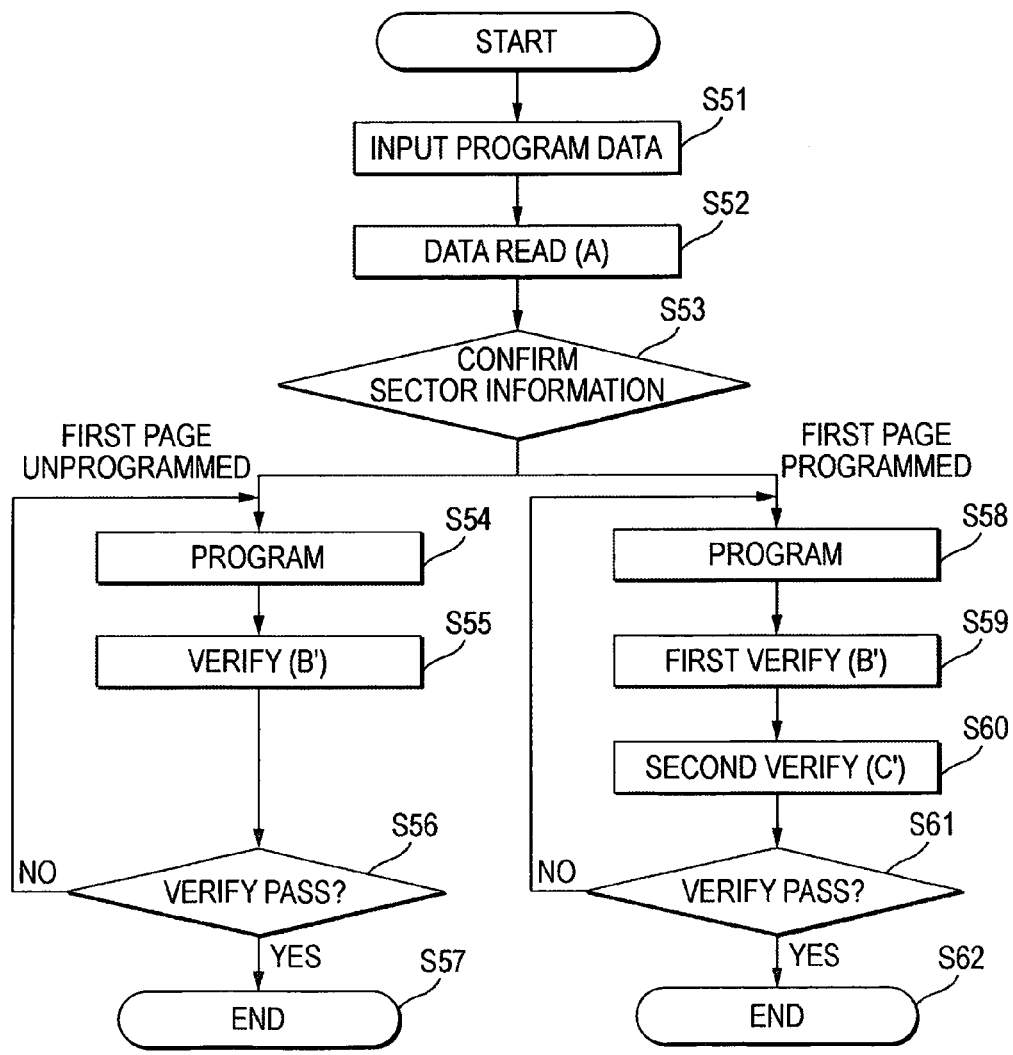
FIG. 10 is a flowchart for explaining a writing operation (a second page programming operation) of the nonvolatile semiconductor memory 200 according to the first embodiment.

Next, the reading operation (read operation) and the writing operation (programming operation) of the nonvolatile semiconductor memory 200 according to the first embodiment will be described with reference to flowcharts in FIGS. 8, 9 and 10.

First of all, description will be given to an operation for reading a first page. FIG. 8(a) is a flowchart showing the operation for reading the first page. In the operation for reading the first page, there are carried out two reading operations including a first read operation for selecting a word line to be an object to carry out the reading operation with a word line voltage set in a state of C (Step S11) and a second read operation for carrying out the reading operation with the word line voltage set in a state of A (Step S12).

In the first read operation, it is decided whether the threshold voltage of the memory cell is set in the "state 2" or less or the "state 3". In the second read operation, it is decided whether the threshold voltage of the memory cell is set in the "state 0" or the "state 1" or more.

Subsequently, the nonvolatile semiconductor memory 200 decides the presence of the programming operation for the first page by referring to the sector information stored in the sector information storage means 13 (Step S13). The reason is as follows. There can be the case of the data "01" and the case of the data "00" depending on any page order in which the data of the memory cell set in the "state 2" are programmed as described above, that is, the case in which the data on the first page are "1" and the case in which the same data are "0". For this reason, it is impossible to decide the data on the first page by the two reading operations.

If it is decided that the data in the sector information storage region are set in the programming state by the decision at the Step S13, that is, when the programming operation for the first page is completed, accordingly, the data of the memory cell set in the "state 2" are "00". Therefore, the data stored in the data latch circuit are output to carry out the reading operation (Steps S14 and S15).

On the other hand, if it is decided that the data in the sector information storage region are set in the erasing state by the decision at the Step S13, that is, when the programming operation for the first page is not completed, the data of the memory cell set in the "state 2" are "01" in some cases. Therefore, the data cannot be read by the two reading operations. However, the programming operation for the first page is not carried out. Irrespective of the data stored in the data latch circuit, therefore, the data "1" are output to carry out the reading operation for the first page (Steps S16 and S17).

Next, description will be given to the reading operation for the second page. FIG. 8(b) is a flowchart showing an operation for reading the second page. In the operation for reading the second page, a word line to be an object is selected to carry out the reading operation with the word line voltage set in a state of B (Step S21). In the first reading operation, it is decided whether the threshold voltage of the memory cell is set in the "state 1" or less or the "state 2" or more. Referring to the data on the second page of the memory cell, the "state 0" and the "state 1" are data "1" and the "state 2" and the "state 3" are data "0" irrespective of the page order in which the programming operation is carried out. Irrespective of the data stored in the sector information storage region (information about whether the first page is programmed or not), therefore, the data stored in the data latch circuit are output to carry out the operation for reading the second page (Steps S22 and S23).

Next, description will be given to an operation for writing the first page. FIG. 9 is a flowchart showing the operation for writing the first page. First of all, program data are input from an outside to the data latch circuit (Step S31). Before the execution of the programming operation, then, a word line to be an object is selected to carry out the reading operation with the word line voltage set in the state of B (Step S32). By carrying out the reading operation with the word line voltage set in the state of B, it is possible to read the data on the second page. A sector to be programmed by the reading operation decides whether the second page has already been programmed or not (Step S33).

In the case in which the programming operation for the second page is not carried out, the programming operation for the first page shown in FIG. 5(b) is performed (Step S34). After the programming operation, then, a verifying operation for confirming whether the memory cell is accurately programmed is carried out (Step S35). In order to decide whether the word line voltage in the verifying operation is programmed into the "state 1", a voltage of A' is applied.

The programming operation and the verifying operation are repetitively carried out until the verifying operation is passed (Step S36). If the verifying operation is passed, the programming operation for the first page is ended. Next, there is executed a programming operation for giving a notice that the programming operation for the first page is completed to the memory cell to be an object of the sector information storage region (Step S42). Consequently, the programming operation for the first page is completed (Step S43).

On the other hand, if the programming operation for the second page is carried out at the Step S33, the programming operation for the first page shown in FIG. 5(a) is executed. At this time, an operation for moving the threshold voltage in the positive direction is carried out if the data are "1" for the memory cell of the threshold voltage set into the "state 2", that is, the programming operation is carried out if the data on the first page are "1", and the threshold voltage is held if the same data are "0". In the case in which the threshold voltage of the memory cell is set into the "state 2", therefore, the data written to the data latch circuit are inverted (Step S37).

After the program data of the data latch circuit in which the threshold voltage of the memory cell are set into the "state 2" are inverted, the programming operation for the first page is carried out (step S38). After the programming operation for the first page is ended, the first and second verifying operations are carried out (Steps S39 and S40). In order to decide whether the word line voltage in the verifying operation is programmed into the "state 1" or the "state 3", a voltage of A' is applied in the first verifying operation and a voltage of C' is applied in the second verifying operation.

The programming operation and the verifying operation are repetitively carried out until the verifying operation is passed (Step S41). If the verifying operation is passed, the programming operation for the first page is ended. Next, there is executed the programming operation for giving a notice that the programming operation for the first page is completed to the memory cell to be the object of the sector information storage region (Step S42). Consequently, the programming operation for the first page is completed (Step S43).

Next, description will be given to the operation for writing the second page. FIG. 10 is a flowchart showing the operation for writing the second page. First of all, program data are input from the outside to the data latch circuit (Step S51). Before the execution of the programming operation, then, a word line to be an object is selected to carry out the reading operation with the word line voltage set in the state of A (Step S52). By carrying out the reading operation with the word line voltage set in the state of A, it is possible to read the data on the first page. At the same time, the information (information about whether the first page has been programmed or not) stored in the sector information storage region 13 is read. A sector to be programmed by the reading operation decides whether the first page has already been programmed or not (Step S53).

In the case in which the programming operation for the first page is not carried out, the programming operation for the second page shown in FIG. 5(a) is performed (Step S54). After the programming operation, then, a verifying operation for confirming whether the memory cell has accurately been programmed is carried out (Step S55). In order to decide whether the word line voltage in the verifying operation has been programmed into the "state 2", the voltage of B' is applied. The programming operation and the verifying operation are repetitively carried out until the verifying operation is passed (Step S56). If the verifying operation is passed, the programming operation for the second page is completed (Step S57).

On the other hand, if the programming operation for the first page is carried out at the Step S53, the programming operation for the second page shown in FIG. 5(b) is executed (Step S58). After the programming operation for the second page is ended, the first and second verifying operations are carried out (Steps S59 and S60). In order to decide whether the word line voltage in the verifying operation has been programmed into the "state 2" or the "state 3", the voltage of B' is applied in the first verifying operation and the voltage of C' is applied in the second verifying operation. The programming operation and the verifying operation are repetitively carried out until the verifying operation is passed (Step S61). If the verifying operation is passed, the programming operation for the second page is completed (Step S62).

Thus, the nonvolatile semiconductor memory 200 according to the first embodiment carries out such a control as to cause the assignment of the data corresponding to the threshold voltage distribution of the memory cell to be variable, thereby performing the programming operation depending on page order in which data on a plurality of pages stored in one memory cell are to be programmed. Herein, the assignment of the data corresponding to the threshold voltage distribution of the memory cell is set to have such a threshold voltage value that the threshold voltage of the memory cell can carry out a transition in a positive direction by the programming operation to be executed later. Accordingly, it is possible to prevent the generation of the case in which the threshold voltage of the memory cell is caused to carry out a transition in a negative direction by the subsequent programming operation. Therefore, it is possible to accurately set the threshold voltage of the memory cell. Thus, it is possible to implement the programming operation in optional page order. Furthermore, a reading operation can be carried out twice at a maximum. Consequently, it is possible to carry out reading at a high speed in the same manner as in the conventional art.

More specifically, the conventional nonvolatile semiconductor memory can carry out programming only in order of a first page and a second page. On the other hand, in the nonvolatile semiconductor memory 200 according to the first embodiment, the programming can be carried out in order of the second page and the first page in addition to the order of the first page and the second page. In order to implement the programming operation in any page order, the assignment of the data corresponding to the threshold voltage distribution of the memory cell is caused to be variable, thereby carrying out the programming operation depending on order in which the first page and the second page are to be programmed.

In the programming operation for a plurality of pages, even if a power supply is turned OFF when a certain page is completely programmed, information about page order in which the programming has been carried out is stored in the sector information storage region 13 to be the programming order information storage means. Therefore, it is possible to carry out the programming operation for the residual pages also after the power supply is turned ON again. Thus, it is possible to enhance a utility of the nonvolatile semiconductor memory and to efficiently utilize an address space.

While the description has been given by taking, as an example, the case in which information about whether the programming operation for the first page has been carried out or not is stored as information to be stored in the sector information storage region 13 in the nonvolatile semiconductor memory 200 according to the first embodiment, this is not restricted but it is also possible to store information about whether the programming operation for the second page has been carried out or not, whether the programming operation for the first page has been first carried out or not, or whether the programming operation for the second page has been first carried out or not.

In the first embodiment, moreover, the information stored in the sector information storage region 13 is read and written by the data latch circuit 40-F. It is also possible to carry out these operations simultaneously with the operation for reading and writing the sector to be the object.

Thus, the programming operation is carried out over the sector information storage region 13 simultaneously with the programming operation to be performed over the memory cell array 10. Consequently, it is possible to effectively eliminate a time taken for carrying out the programming operation over the sector information storage region 13. Thus, it is possible to perform the programming operation in optional page order without increasing a time required for carrying out the programming over the memory cell array. By carrying out the operation for reading the data stored in the sector information storage region 13 simultaneously with the reading operation to be carried out over the memory cell array, moreover, it is possible to effectively eliminate the time taken for executing the reading operation over the sector information storage region 13. Therefore, it is possible to carry out the programming operation in optional page order while maintaining an increase in a reading speed over the memory cell array.

While the description has been given to the example in which the sector information storage region 13 is constituted in the memory cell array 10, moreover, this it not restricted but the sector information storage region 13 may be constituted on the outside separately from the memory cell array 10.

Second Embodiment

Next, a second embodiment according to the invention will be described with reference to the drawings.

Figure 11:
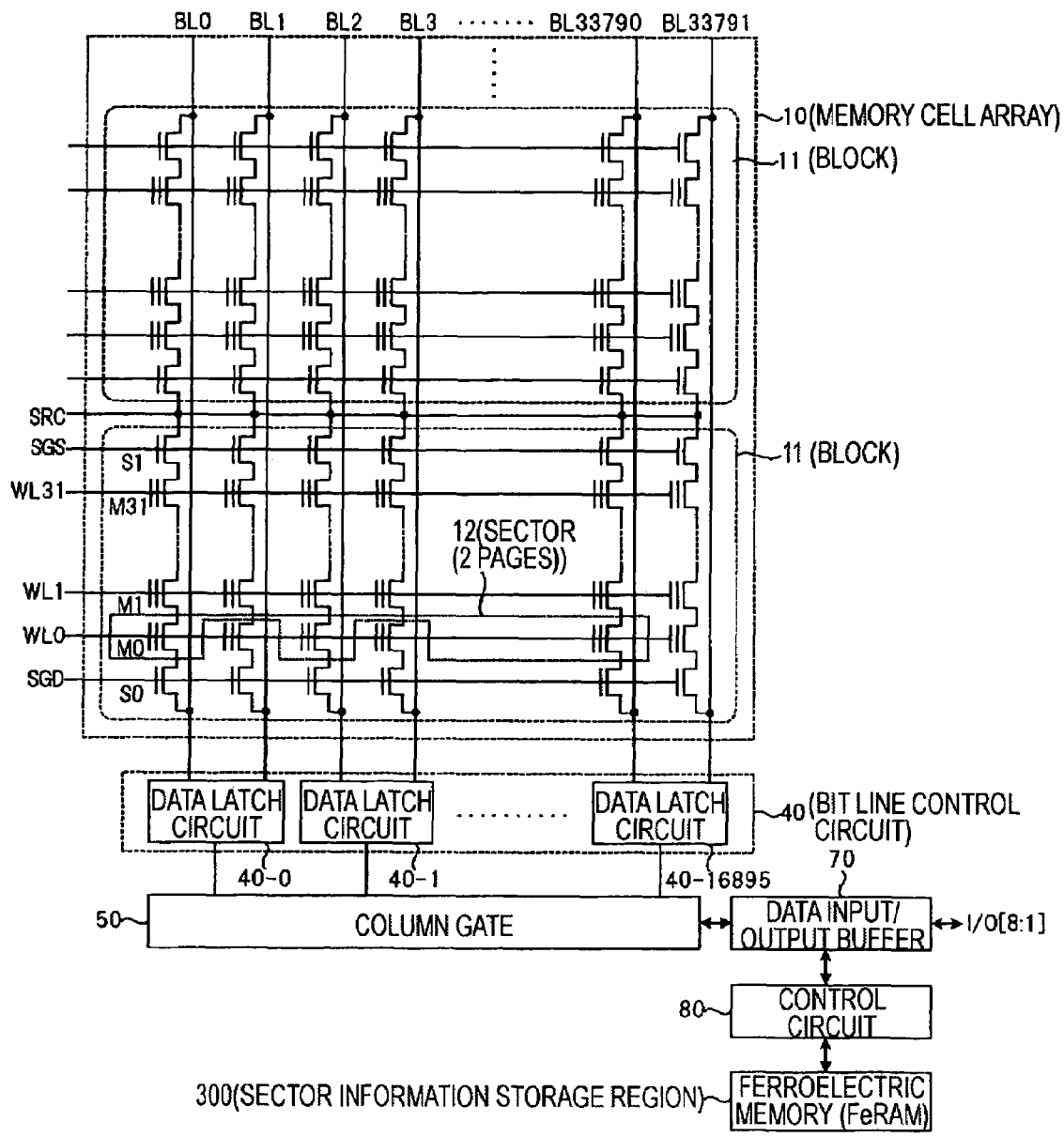
FIG. 11 is a diagram showing a structure of a nonvolatile semiconductor memory 200 according to a second embodiment.
Figure 12:
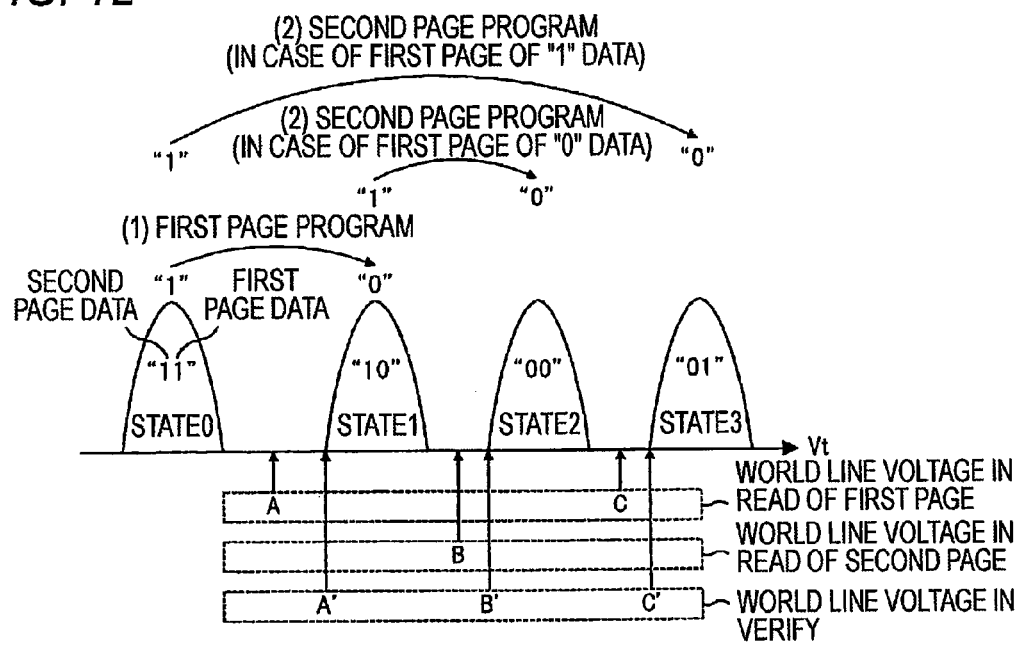
FIG. 12 is a diagram showing a relationship between a threshold voltage distribution and data of a memory cell in a nonvolatile semiconductor memory described in JP-A-2001-93288, and writing and reading methods.
Figure 13:
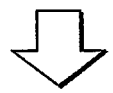
FIG. 13 is a diagram showing a relationship between the data of the memory cell in the nonvolatile semiconductor memory described in JP-A-2001-93288 and write and read data.

FIG. 11 is a diagram showing a structure of a nonvolatile semiconductor memory 200 according to the second embodiment. In FIG. 11, components having the same functions as those in the first embodiment have the same reference numerals and detailed description thereof will be omitted. Only portions having different structures will be described below.

FIG. 11 is different from FIG. 4 described in the first embodiment in that a sector information storage region has a different structure. While the sector information storage region 13 is disposed in the memory cell array 10 in the first embodiment, the sector information storage region is comprised of a ferroelectric memory (FeRAM) 300 in the second embodiment.

Thus, the sector information storage region is comprised of the ferroelectric memory (FeRAM) 300 capable of carrying out a high-speed reading operation, a high-speed writing operation and an overwriting operation. Consequently, it is possible to increase the speeds of the writing and reading operations to be carried out over the sector information storage region. In addition, it is possible to perform the overwriting operation. Thus, it is possible to obtain a control easiness of an operation for writing sector information to the sector information storage region. Accordingly, it is possible to enhance a performance of the nonvolatile semiconductor memory capable of executing a programming operation in optional page order. Since a read operation and a programming operation according to the second embodiment are the same as those described in the first embodiment, detailed description thereof will be omitted.

While the embodiments according to the invention have been described above, the nonvolatile semiconductor memory according to the invention is not restricted to only the examples but various changes can be effectively made without departing from the scope of the invention.

For example, the multivalued technique is not restricted to 2 bit/cell but may be more. While the description has been given to the example in which the structure is obtained by the NAND type memory cell array in the embodiments, moreover, this is not restricted but an AND type memory cell array and an NOR type memory cell array may be employed.

The nonvolatile semiconductor memory for storing multivalued data according to the invention is useful for a nonvolatile semiconductor memory capable of increasing a speed of an operation for reading data, and furthermore, carrying out a writing operation in optional page order.

What is claimed is:

1. A nonvolatile semiconductor memory, comprising:
  a memory cell array comprised of a multivalued memory cell for storing data on a plurality of pages;
  a data processing circuit for carrying out a read operation for reading data from the memory cell array and a programming operation for writing the data to the memory cell array on a page unit; and
  a control circuit for controlling the operations of the data processing circuit,
  wherein the control circuit changes relationship between the data and threshold voltage distribution of the multivalued memory cell,
  the relationship is changed based on a plurality of orders of pages, the orders including an order from a first page to a second page and an order from the second page to the first page, and
  in the pages, the programming operation is to be carried out in such a manner that a transition of a threshold voltage of the multivalued memory cell in a positive direction is performed to execute the programming operation.

2. The nonvolatile semiconductor memory, according to claim 1, further comprising:
  a programming order information storage for storing order of a page in an execution of the programming operation;
  wherein the control circuit carries out the read operation by determining data corresponding to the threshold voltage distribution of the memory cell by referring to the programming order information.

3. A nonvolatile semiconductor memory, comprising:
  a memory cell array comprised of a multivalued memory cell for assigning data on a first page and a second page to different threshold voltages set in a "state 0", a "state 1", a "state 2" and a "state 3" and storing the data;
  a data processing circuit for carrying out a programming operation for writing data on a first or second logic level supplied from an outside to the memory cell array on a page unit and a read operation for reading the data from the memory cell array; and a control circuit for controlling the operations of the data processing circuit depending on a plurality of orders of pages in which the programming operation is to be carried out, wherein in the case in which the programming operation is to be carried out in order from the first page to the second page;

the control circuit holds the "state 0" when a first logic level is to be programmed and carries out a change from the "state 0" to the "state 1" when a second logic level is to be programmed in the programming operation for the first page; and in the programming operation for the second page, the control circuit holds the "state 0" when the first logic level is to be programmed and carries out a change from the "state 0" to the "state 3" when the second logic level is to be programmed in the case in which the first logic level is stored in the first page, and holds the "state 1" when the first logic level is to be programmed and carries out a change from the "state 1" to the "state 2" when the second logic level is to be programmed in the case in which the second logic level is stored in the first page, and in the case in which the programming operation is to be carried out in order from the second page to the first page, the control circuit holds the "state 0" when the first logic level is to be programmed and carries out a change from the "state 0" to the "state 2" when the second logic level is to be programmed in the programming operation for the second page, and in the programming operation for the first page, the control circuit holds the "state 0" when the first logic level is to be programmed and carries out a change from the "state 0" to the "state 1" when the second logic level is to be programmed in the case in which the first logic level is stored in the second page, and carries out a change from the "state 2" to the "state 3" when the first logic level is to be programmed and holds the "state 2" when the second logic level is to be programmed in the case in which the second logic level is stored in the second page.

4. The nonvolatile semiconductor memory according to claim 3, further comprising:

a programming order information storage for storing order of a page in an execution of a programming operation, the control circuit referring to the programming order information, and in case of a state in which only the first page is programmed or a state in which the first page and the second page are programmed, outputting the first logic level when the threshold voltage of the multivalued memory cell is set in the "state 0" and the "state 3" and outputting the second logic level when the threshold voltage of the multivalued memory cell is set in the "state 1" and the "state 2" in an operation for reading the first page, and outputting the first logic level when the threshold voltage of the multivalued memory cell is set in the "state 0" and the "state 1" and outputting the second logic level when the threshold voltage of the multivalued memory cell is set in the "state 2" and the "state 3" in an operation for reading the second page, and in case of a state in which only the second page is programmed, outputting the first logic level irrespective of a state of the threshold voltage of the multivalued memory cell in the operation for reading the first page, and outputting the first logic level when the threshold voltage of the multivalued memory cell is set in the "state 0" and the "state 1" and outputting the second logic level when the threshold voltage of the multivalued memory cell is set in the "state 2" and the "state 3" in the operation for reading the second page.

5. The nonvolatile semiconductor memory according to claim 2 or 4, wherein the control circuit carries out an operation for storing programming order information in the programming order information storage simultaneously with a programming operation to be performed over the memory cell array.

6. The nonvolatile semiconductor memory according to claim 2 or 4, wherein the control circuit carries out a read operation for the programming order information stored in the programming order information storage simultaneously with a read operation to be performed over the memory cell array.

7. The nonvolatile semiconductor memory according to claim 2 or 4, wherein the programming order information storage is comprised of a memory cell connected to an identical word line to the multivalued memory cell.

8. The nonvolatile semiconductor memory according to claim 4, wherein the programming order information storage stores data at a threshold voltage set in the "state 3" of the multivalued memory cell.

9. The nonvolatile semiconductor memory according to claim 2, wherein the programming order information storage is comprised of a ferroelectric memory (FeRAM).

10. The nonvolatile semiconductor memory according to claim 1, wherein the memory cell array is comprised of an NAND type memory cell array.

* * * * *

UNITED STATES PATENT AND TRADEMARK OFFICE
CERTIFICATE OF CORRECTION

| | | |
|---|---|---|
| PATENT NO. | : 7,623,372 B2 | Page 1 of 1 |
| APPLICATION NO. | : 11/593607 | |
| DATED | : November 24, 2009 | |
| INVENTOR(S) | : Kazuyuki Kouno | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 238 days.

Signed and Sealed this

Fourteenth Day of December, 2010

David J. Kappos
*Director of the United States Patent and Trademark Office*